US006989776B2

(12) United States Patent
Tsang

(10) Patent No.: US 6,989,776 B2
(45) Date of Patent: Jan. 24, 2006

(54) GENERATION OF INTERLEAVED PARITY CODE WORDS HAVING LIMITED RUNNING DIGITAL SUM VALUES

(75) Inventor: Kinhing P. Tsang, Plymouth, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 110 days.

(21) Appl. No.: 10/715,078

(22) Filed: Nov. 17, 2003

(65) Prior Publication Data
US 2005/0104755 A1 May 19, 2005

(51) Int. Cl.
H03M 5/00 (2006.01)
H03M 7/00 (2006.01)

(52) U.S. Cl. .......................................... 341/59; 341/58
(58) Field of Classification Search .................. 341/59, 341/58, 61, 94; 714/755, 769, 786, 802, 714/811, 768; 375/265, 377; 360/29
See application file for complete search history.

(56) References Cited

U.S. PATENT DOCUMENTS

| | | | | |
|---|---|---|---|---|
| 5,608,397 A | 3/1997 | Soljanin | ....................... | 341/58 |
| 5,731,768 A | 3/1998 | Tsang | ........................... | 341/59 |
| 5,781,133 A | 7/1998 | Tsang | ........................... | 341/59 |
| 5,801,649 A | 9/1998 | Fredrickson | ................. | 341/58 |
| 5,838,267 A | 11/1998 | Wang | ........................... | 341/94 |
| 5,958,081 A * | 9/1999 | Lemense et al. | ............ | 714/811 |
| 6,009,549 A | 12/1999 | Bliss | ........................... | 714/769 |
| 6,009,550 A | 12/1999 | Gosula | ........................ | 714/769 |
| 6,067,656 A * | 5/2000 | Rusu et al. | .................. | 714/768 |
| 6,201,485 B1 | 3/2001 | McEwen | ....................... | 341/59 |
| 6,202,189 B1 | 3/2001 | Hinedi | ........................ | 714/786 |
| 6,288,655 B1 | 9/2001 | Tsang | ........................... | 341/59 |
| 6,304,397 B1 | 10/2001 | Ozue | ........................... | 360/24 |
| 6,424,690 B1 | 7/2002 | Kay | ........................... | 375/377 |
| 6,426,978 B1 | 7/2002 | Bottomley | ................... | 375/265 |
| 6,505,320 B1 | 1/2003 | Turk | ........................... | 714/755 |
| 6,603,412 B2 * | 8/2003 | Gatherer et al. | .............. | 341/61 |
| 6,604,219 B1 * | 8/2003 | Lee et al. | .................... | 714/769 |
| 6,631,490 B2 * | 10/2003 | Shimoda | ..................... | 714/755 |
| 6,661,356 B1 * | 12/2003 | Oberg | ........................ | 341/58 |
| 6,696,991 B2 * | 2/2004 | Shim et al. | ................... | 341/58 |
| 6,795,947 B1 * | 9/2004 | Siegel et al. | ................. | 714/802 |
| 6,891,483 B2 * | 5/2005 | Noda et al. | ................... | 341/58 |

* cited by examiner

Primary Examiner—Patrick Wamsley
(74) Attorney, Agent, or Firm—Westman, Champlin & Kelly, P.A.

(57) ABSTRACT

An encoding system for encoding digital data for transmission through a communication channel is described, which includes a DCF encoder and a parity encoder operatively coupled to the DCF encoder. The DCF encoder is adapted to receive a first data sequence, and to generate a first DCF code word and a new running digital sum as functions of the first data sequence and a pre-existing running digital sum, wherein the new running digital sum is limited to a maximum absolute value. The parity encoder is operatively coupled to the DCF encoder, and adapted to receive the first DCF code word from the DCF encoder, and to generate a first interleaved parity code word as a function of the first DCF code word, and to provide the first interleaved parity code word to a channel.

28 Claims, 15 Drawing Sheets

GENERATION OF INTERLEAVED PARITY CODE WORDS HAVING LIMITED RUNNING DIGITAL SUM VALUES

FIELD OF THE INVENTION

The present invention relates to communicating digital data through a communication channel. More particularly, the present invention relates to encoding, transmitting, and decoding digital data through a communication channel based on improved coding systems.

BACKGROUND OF THE INVENTION

In the field of digital communications, digital information is typically prepared for transmission through a channel by encoding it. The encoded data is then used to modulate a transmission to the channel. A transmission received from the channel is then typically demodulated and decoded to recover the original information.

The encoding of digital data serves to improve communication performance so that the transmitted signals are less corrupted by noise, fading, or other interference associated with the channel. The term "channel" can include media such as conducting transmission lines, electromagnetic waves propagated through the atmosphere or otherwise among wireless devices, information storage devices such as disc drives, or any other particular type of channel involved in the transmission or storage of a signal.

In the case of information storage devices, the signal may be stored in the channel for a period of time before it is accessed or received. Encoding can reduce the probability of error during data recovery, when the encoding is adapted to the known characteristics of the data and its interaction with known noise characteristics of a communication channel.

In a typical encoding protocol, individual data sequences of m data bits are encoded into larger data sequences of n code bits, and the ratio m/n is known as the code rate of the encoding protocol. Decreasing the code rate may reduce the complexity of the encoder and decoder and improve error correction. However, decreasing the code rate may also increase energy consumption and decrease the rate of transmission.

There are also advantages to encode a data sequence to have a spectral null at zero frequency. Such a sequence is said to be DC free (DCF), and is found to enhance performance particularly in perpendicular magnetic recording. A given digital sequence consists of bits, each of which is either a 1 or a 0. In a corresponding bipolar representation, each bit corresponds to a bipolar symbol. Particularly, each 1 corresponds to a +1 and each 0 corresponds to a −1. An ongoing digital sequence can be characterized by a running digital sum (RDS), which is the result of summing the bipolar symbols corresponding to the sequence. A DCF sequence is one in which the RDS is bounded, or maintained within a bound, or a maximum absolute value, regardless of the run length of the sequence. A bound, particularly a relatively small one, may improve the performance of the channel.

It is particularly desired in many applications of data transmission to encode and transmit data in a way that optimizes the combination of competing interests such as complexity of encoder and decoder, error correction, energy consumption, speed of communication, minimized running digital sum, and other performance characteristics. Various embodiments of the present invention address these problems, and offer other advantages over the prior art.

SUMMARY OF THE INVENTION

The present invention relates to systems and methods for encoding digital data for transmission through a communication channel and provides solutions to persistent problems in the art including those described above.

One embodiment includes a DCF encoder and a parity encoder operatively coupled to the DCF encoder. The DCF encoder is adapted to receive a first data sequence, and to generate a first DCF code word and a new running digital sum as functions of the first data sequence and a pre-existing running digital sum, wherein the new running digital sum is limited to a maximum absolute value. The parity encoder is operatively coupled to the DCF encoder, and adapted to receive the first DCF code word from the DCF encoder, and to generate a first interleaved parity code word as a function of the first DCF code word, and to provide the first interleaved parity code word to a channel.

In another representative embodiment, the encoding system also includes an RLL encoder operatively coupled to a transition precoder which is operatively coupled to the DCF encoder. The RLL encoder is adapted to receive an RLL input data sequence, and to generate a first RLL code word as a function of the RLL input data sequence. The transition precoder is adapted to receive the first RLL code word, and to generate a transition precoded code word as a function of the first RLL code word, wherein the first data sequence, received by the DCF encoder, is a function of the first transition precoded code word.

DETAILED DESCRIPTION OF DEPICTED EMBODIMENTS

The present invention is described in detail with reference to the accompanying figures. These figures and descriptions show certain illustrative embodiments. While it would be impossible to demonstrate details of every conceivable embodiment, those skilled in the art will recognize many other embodiments not particularly described here that lie within the metes and bounds established by the present claims and specification.

Figure 1:
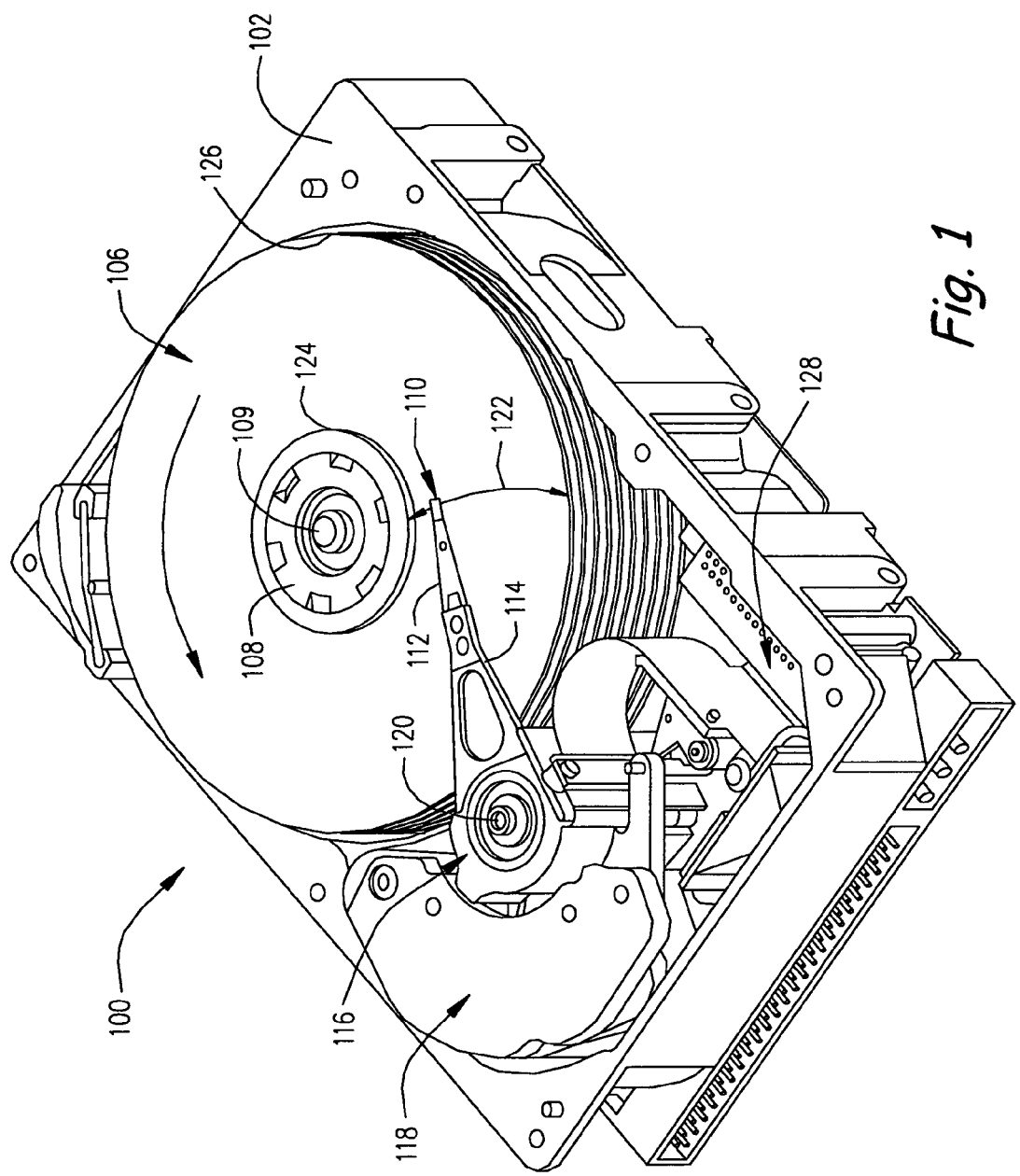
FIG. 1 is a perspective view of an embodiment of a magnetic disc drive in which the present invention can be used.

FIG. 1 is a perspective view of a magnetic disc drive 100, one example of many possible environments in which the present invention is useful. Disc drive 100 communicates with a host system (not shown) and includes a housing with a base 102 and a top cover (not shown). Disc drive 100 further includes a disc pack 106, which is mounted on a spindle motor (not shown), by a disc clamp 108. Disc pack 106 includes a plurality of individual discs, which are mounted for co-rotation about central axis 109. Each disc surface has an associated head, which is mounted to disc drive 100 for communication with the disc surface. In the example shown in FIG. 1, heads 110 are supported by suspensions 112 which are in turn attached to track accessing arms 114 of an actuator 116. The actuator shown in FIG. 1 is of the type known as a rotary moving coil actuator and includes a voice coil motor (VCM), shown generally at 118. Voice coil motor 118 rotates actuator 116 with its attached heads 110 about a pivot shaft 120 to position heads 110 over a desired data track along an arcuate path 122 between a disc inner diameter 124 and a disc outer diameter 126. Voice coil motor 118 operates under control of internal circuitry 128.

The heads 110 and rotating disc pack 106 form a communication channel that can receive digital data and reproduce the digital data at a later time. Write circuitry within internal circuitry 128 receives data, typically from a digital computer, and then encodes data in code words adapted to the communication channel. The encoded data is then used to modulate a write current provided to a write transducer in the head 110. The write transducer and the head 110 cause successive code words to be encoded on a magnetic layer on disc pack 106. At a later time, a read transducer in the head recovers the successive code words from the magnetic layer as a serial modulated read signal. Read circuitry within internal circuitry 128 demodulates the read signal into successive parallel code words. The demodulated code words are then decoded by decoder circuitry within circuitry 128, which recovers the digital data for use, by host system 101, at a later time.

In order to encode data that is written onto a magnetic layer on disc pack 106, a system according to the present invention is used. According to an embodiment of the present invention, the data to be encoded for transmission through a communication channel is received as multiple data sequences by an encoding system within internal circuitry 128.

Figure 2:
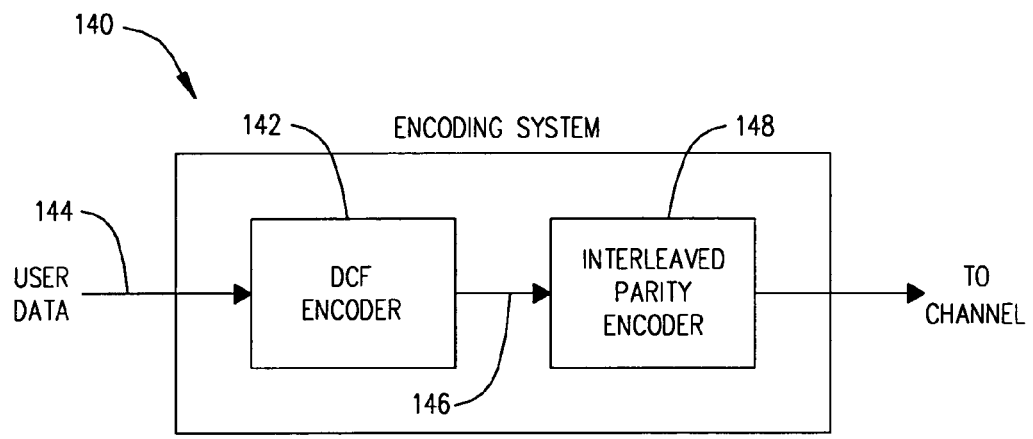
FIG. 2 is a block diagram of a first embodiment of a system for encoding and transmitting data according to the present invention.

FIG. 2 is a block diagram of an embodiment of a system 140 for encoding and transmitting data according to the present invention, representing circuitry contained within internal circuitry 128, and the function of that circuitry.

The direct current free encoder, or DCF encoder 142 contributes to coding system performance by limiting the running digital sum (RDS) of cumulative sequences of data. A given data sequence is represented by a series of binary digits, or bits, each of which is either a 1 or a 0. In a corresponding bipolar representation, each bit corresponds to a bipolar symbol. Particularly, each bit of 1 corresponds to a bipolar symbol of +1, and each bit of 0 corresponds to a bipolar symbol of −1.

A discrete data word or data sequence can be characterized by a digital sum resulting from summing the bipolar symbols corresponding to the bits of data comprised therein. Similarly, an ongoing sequence of data can be characterized by a running digital sum (RDS), which is the result of summing the bipolar symbols corresponding to cumulative data words or data sequences.

A DCF sequence is one in which the RDS is limited to be less than or equal to a bound, which is a maximum absolute value, regardless of the run length of the sequence. A DCF sequence has a spectral null at zero frequency. A bound, particularly a relatively small one, may enhance system performance, particularly in perpendicular magnetic recording.

In this embodiment, the DCF encoder 142 within internal circuitry 128 receives data including a plurality of data sequences from input 144. The DCF encoder 142 receives a particular data sequence, and adds a DCF state bit to the data sequence to form a preliminary data word.

The DCF encoder then performs an operation to ensure the RDS including the digital sum of the new DCF code word is the closer to 0 of the two available options.

For example, the DCF encoder 142 then determines the digital sum of the preliminary data word. The DCF encoder 142 then compares the sign of the digital sum of the preliminary data word with the sign of the pre-existing RDS. If the new digital sum (of the preliminary data word) and the RDS have opposite signs, then the DCF encoder 142 outputs the preliminary data word as the DCF code word to operative connection 146.

If on the other hand, the new digital sum and the RDS have the same sign, then the DCF encoder 142 generates a new DCF data word which is the inverted form of the preliminary data word. In other words, each bit of the DCF data word is the inverted form of the corresponding bit in the preliminary data word, such that a 1 is substituted for every 0 and a 0 for every 1. Then the DCF encoder 142 outputs this DCF code word to operative connection 146.

Either way, the DCF encoder 142 also adds the digital sum of the DCF code word to the pre-existing RDS to form a new RDS, which is closer to 0 than if the opposite operation had been performed.

It's possible that the pre-existing RDS in this embodiment may already be precisely zero, in which case the action of the DCF encoder 142 will not have one choice of DCF code word that will shepherd the RDS nearer to zero than the opposing option in the particular iteration. In that case, the default action may vary in different embodiments according to any of several rules, while assuring that the subsequent DCF encoding iteration will again allow one option that steers the RDS closer to zero than would the opposing option.

The DCF state bit can be either a 0 or a 1, and can appear in an arbitrary position relative to the data sequence. In one embodiment, the DCF state bit is added as a 0 after the end of the input data sequence, before it is compared with its inverted form. The details of the DCF state bit are unimportant, as long as it is used consistently to indicate during decoding which of the two possible DCF states, uninverted or inverted, the data sequence was encoded in the DCF code word. The DCF code word contains the information contained in the particular input data sequence.

If n is the number of bits contained in a DCF code word, then one DCF code word contains n−1 bits of information from an input data sequence. Any code can be rated by a code rate which indicates the proportion with which the code contains useful information. The code rate equals the number of bits contained in the encoded useful information, divided by the number of bits contained in the corresponding code word. So, each DCF code word has a code rate of (n−1)/n.

In an illustrative embodiment, a DCF encoder 142 is adapted for n=21, and to receive a plurality of individual data sequences, each of (n−1)=20 bits, comprising a cumulative data sequence. Each individual data sequence here consists of 20 bits of data. In this embodiment, the DCF state bit takes the form of a 0 added to the end of the sequence, to provide a series of 21 bits in the intermediate step. The DCF encoder then evaluates the intermediate data word of 21 bits to decide which state will provide a digital sum of opposite sign to the pre-existing RDS, and selects that state. The code rate in this example is 20/21=0.952 (approximately).

For example, the input data sequence may be 10100100010001101110. After the addition of a DCF state bit of 0 at the end of the sequence, the sequence in its intermediate state is 101001000100011011100. The bipolar symbols corresponding to this sequence, using a plus sign "+" to indicate a "+1" and a minus sign "−" to indicate a "−1", is +−+−−+−−−+−−−++−+++−−. The digital sum is found by summing the sequence, giving −3. The pre-existing RDS is −2, for example. Then, since the digital sum of the current sequence is of the same sign as the pre-existing RDS, the DCF converter selects to invert the sequence and output the inverted form as the DCF code word, which in this case, is then 010110111011100100011. The new RDS is found by summing the pre-existing RDS of −2 with the digital sum of the inverted sequence output as the DCF code word, giving a DCF code word digital sum of +3, and a new RDS of +1.

A subsequent data sequence may then be considered, which for example is 00000000001111111111. With DCF state bit, this becomes 000000000011111111110, which has a digital sum of −1. Since this digital sum is already of opposite sign of the pre-existing RDS of +1, the DCF encoder 142 selects to output the sequence in its uninverted form as the DCF code word, which is then 000000000011111111110. The new RDS then becomes −1+1=0.

According to an embodiment of the present invention as represented in FIG. 2, a parity encoder 148 is operatively coupled to the DCF encoder 142 via operative connection 146, and adapted to receive the output of the DCF encoder 142 as input to the parity encoder 148. The DCF code words that are output from the DCF encoder 142 may then be encoded again by the parity encoder 148 into parity code words, increasing their difference from each other thus providing unexpected advantages in coding performance. Each parity code word then contains the information from the original data sequence, combined with the advantages of both DCF encoding and parity encoding, with only a minimal tradeoff in code rating.

The bit length of the parity code words may be arbitrarily related to the bit length of the DCF code words. For example, DCF code words of 20 bits each may be put to the parity encoder, which may generate parity code words of 350 bits each; or DCF code words of 101 bits each may correspond to generated parity words of 61 bits each. In any case, the parity words are generated as functions of the input code words.

The generation of the parity code words may take place in an arbitrary relation with the interleaving of the parity code words to generate interleaved parity code words. Each interleaved parity code word contains an integral number of component parity code words, with at least one parity bit per component parity code word. The integral number of component parity code words within the interleaved parity code word is referred to as the degree of interleaving.

A parity code word includes at least one parity bit added to the input code word, producing a parity code word of a selected parity. A selected parity includes both a modulus common to the system, and a residue that can be selected for each parity code word produced in the system. The values that can be selected for the modulus depend on how many parity bits are included in the parity code word by the parity encoder 148, while the residue of a parity code word depends on what the values of the added parity bits are when combined with the bits of the input code word. Particularly, the parity bits are selected such that the base of a code word is congruent to the residue, with respect to the given modulus. This is defined such that the difference between the base and the residue is an integral multiple of the modulus.

For example, the simplest form of parity is based on a single parity bit. This is even or odd parity. It provides a modulus of 2, and a residue of either 0 or 1. For example, the parity encoder 148 may select for an even number of ones in the parity code word, and the base may be defined as the number of ones (i.e. the number "1") in the input code word. In that case, the parity encoder 148 will count the number of ones in the input code word, and if that number is odd, it will add a 1 as the parity bit, while if the number is already even, it will add a 0 as the parity bit. This ensures that the parity code word will always have an even number of ones. Alternately, the parity encoder 148 may select for an odd number of ones, in which case it will add a parity bit of 1 if the input code word contains an even number of ones, or add a 0 as parity bit if the input code word has an odd number of ones.

Other ways of encoding parity exist within the present invention that may be equally or more appropriate depending on the needs of an embodiment. For instance, if the base is defined as the digital sum, and the parity is of modulus 2, i.e. even or odd, and the input code word has an odd number of bits, then the parity will function equivalently as that described above. If however this is changed only by making the input code word of an even number of bits, then the residue of the digital sum will be opposite the parity of the number of ones in the input code word. In that case, an odd number of ones implies also an odd number of zeroes and therefore an even digital sum, so that a parity bit of 0 will produce a parity code word of even parity, and vice versa.

Figure 5:
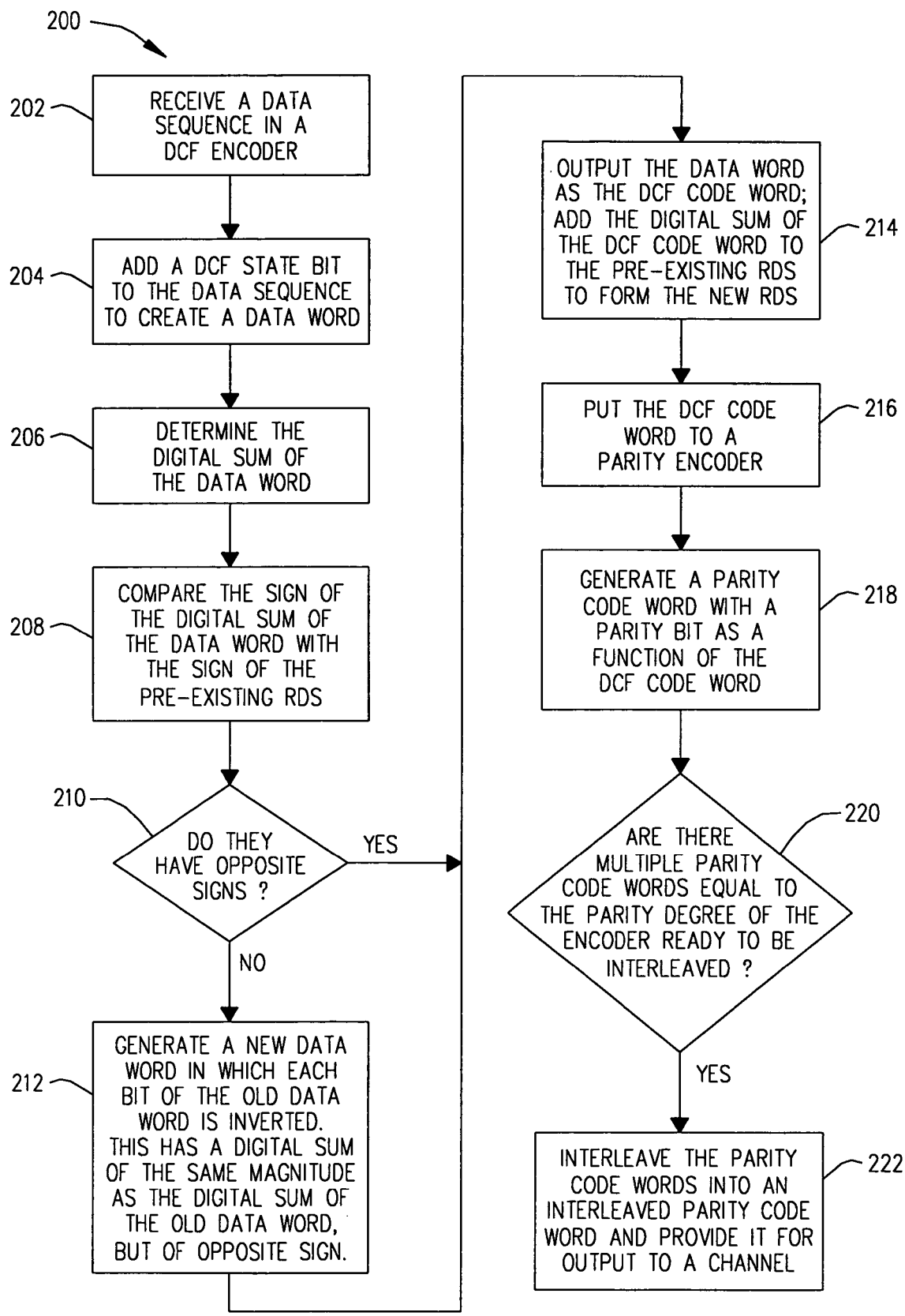
FIG. 5 is a flow chart of an embodiment of a method aspect of a system for encoding and transmitting data according to the present invention.
Figure 11:
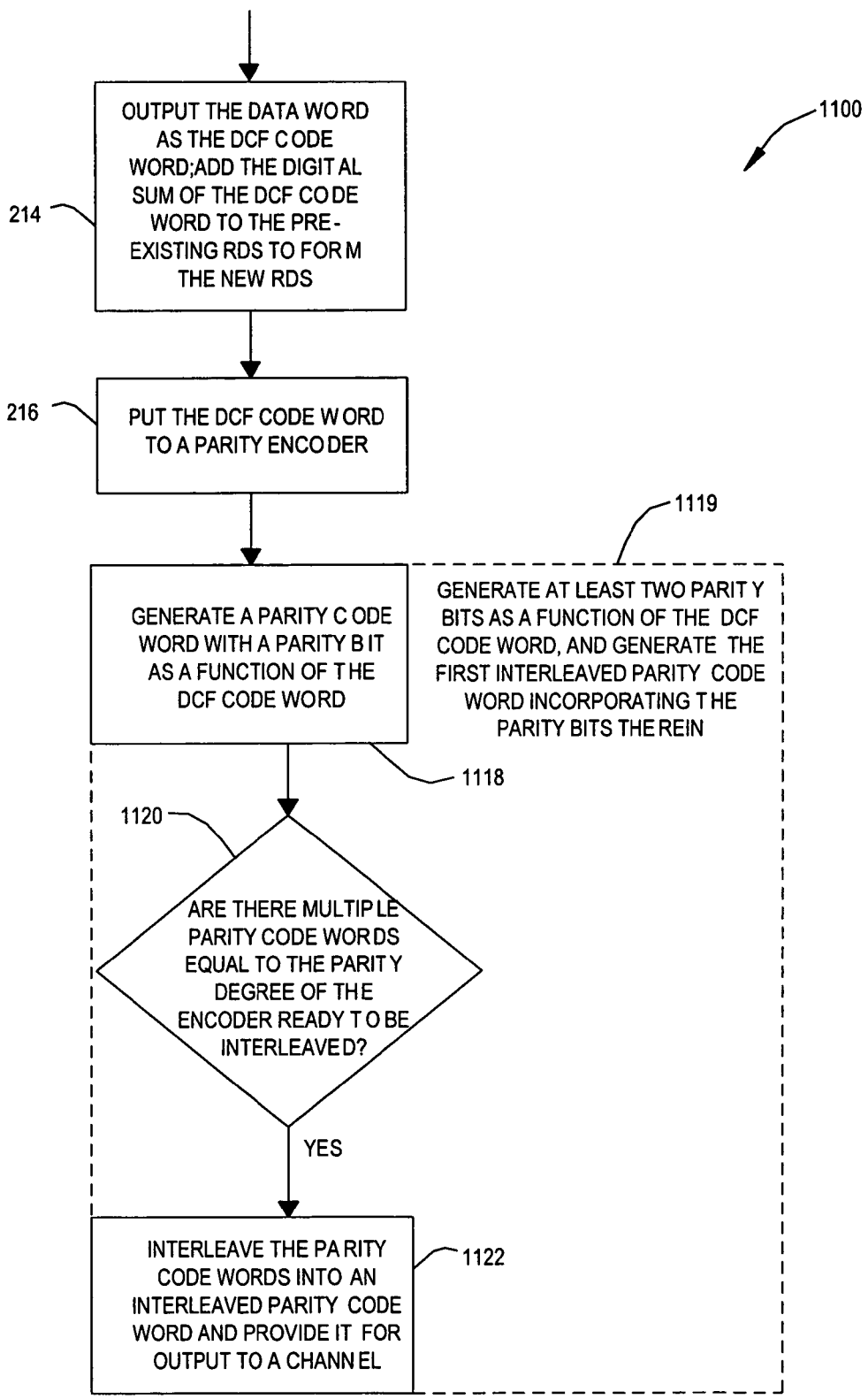
FIG. 11 is a flow chart depicting a system for encoding and transmitting data according to the present invention, according to another illustrative embodiment.

Parity of greater than modulus 2 is also possible, and will be desirable for some applications due to an enhanced capability for error correction. In one illustrative embodiment depicted in FIG. 11, analogous in many steps to FIG. 5, illustrative method 1100 includes illustrative optional condition 1119, associated generally with steps 1118, 1120, and 1122, wherein a parity encoder adapted to generate a second interleaved parity code word incorporating information from the first DCF code word, and to provide the second interleaved parity code word to a channel. For instance, if two parity bits are added and the base is calculated with a simple counting code, where each bit may contribute either 1 or 0 to the base, then a modulus of 3 is defined. No matter what input code word is presented, the parity encoder can produce a corresponding parity code word congruent to either 0, 1 or 2 modulo 3. Similarly, greater error correction may be provided by using a greater number of parity bits above 2. The running digital sum of a code word may also serve as the base of the code word.

In this embodiment, the parity encoder 148 is also adapted to interleave separate parity code words into a larger, interleaved parity code word. In various embodiments, this function could be performed by a second stage separate unit operatively connected to the first stage parity encoder. Whether the two stages are remotely or intimately connected in a particular embodiment, they together comprise the parity encoder 148.

Interleaving separate parity code words together may be done by any of a variety of selected rules. It involves generating a new interleaved code word comprising each bit from each interleaved parity code word. Many possible interleaving rules exist which provide a pseudorandom bit mapping. As an example of this, if two input code words are represented as A9 A8 A7 A6 A5 A4 A3 A2 A1 and B9 B8 B7 B6 B5 B4 B3 B2 B1 B0, an illustrative pseudorandom interleaved code word might read A4 B3 A2 A9 B1 A5 B9 A3 A6 B4 A0 B5 B8 B0 A8 A7 B7 B2 A1 B6. A pseudorandom interleaving rule may be of particular advantage in some applications.

Other possible interleaving rules involve bit-wise interleaving, which has a particular simplicity and ease of implementation and offers special advantages in many applications. In one illustrative example of bit-wise interleaving, the bits of each of two input code words of the same representation as above are assembled into an interleaved code word in alternating order, providing the interleaved code word A9 B9 A8 B8 A7 B7 A6 B6 A5 B5 A4 B4 A3 B3 A2 B2 A1 B1 A0 B0.

One of the advantages of interleaving may be considered in the example where a signal is influenced by an error event which reverses each pair of two adjacent bits of an interleaved code word, from a 0.1 to a 1 0. Certain error-detection properties of these two pairs, such as sum of ones (or the Hamming weight) and digital sum, remain the same after the error event, so would not be corrected by error correction sub-systems such as parity encoding that rely alone on properties such as those. However, because of the interleaving encoding, the two adjacent bits will each belong to a different parity code and each of these two bits will represent an error that will be corrected by those same sub-systems, once the interleaved code word is de-interleaved by the decoding component of the embodiment, assuming the two bits were assigned their places in the interleaved code word such that they are from separate input code words.

This is a case in which bit-wise and certain other rules of interleaving would be particularly advantageous, wherein they provide the assurance that two adjacent bits will always belong to two different component or input code words. Therefore, it would assure that the error event described above would be detected and corrected.

The parity encoder 148 has a degree of interleaving. The degree is expressed as an integer equal to the number of parity code words that are interleaved together into an interleaved code word. For instance, the examples above demonstrated interleaving of degree 2, with two code words of ten bits each interleaved together. Another embodiment discussed below has an interleave degree of four. Other embodiments may have a wide variety of interleave numbers, such as 100 or 10,000. The interleave degree is bounded only by the system requirements of encoding and decoding data, and may be selected to optimize certain aspects of performance over others depending on the needs of a particular application.

Figure 3:
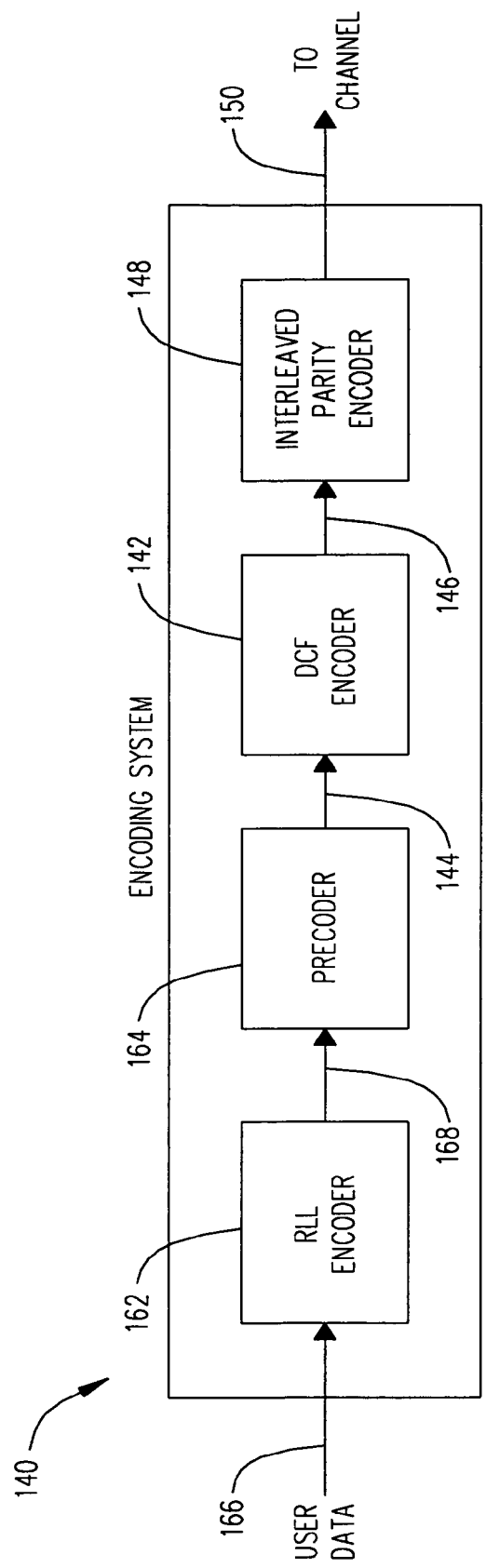
FIG. 3 is a block diagram of a second embodiment of a system for encoding and transmitting data according to the present invention.

FIG. 3 depicts another embodiment of a system 140 for encoding and transmitting data according to the present invention. In this embodiment, a data sequence received from input 166 is first input to an RLL (i.e. run length limited) encoder 162, which is operatively coupled via operative connection 168 to a transition precoder 164, which is in turn operatively coupled via operative connection 144 to a DCF encoder 142 similar to the one discussed above, which itself is operatively coupled via operative connection 146 to an interleaved parity encoder 148 similar to the one discussed above. In this embodiment, all of the above components may be comprised within the internal circuitry 128. In other embodiments, the RLL encoder 162 may be operatively coupled to the DCF encoder 142 directly, without the intervention of the transition precoder 164. The intermediary coupling of the transition precoder 164 nevertheless is comprised in an operative coupling of the RLL encoder 162 to the DCF encoder 142 in embodiments of the system 140 such as the one in FIG. 3.

Figure 16:
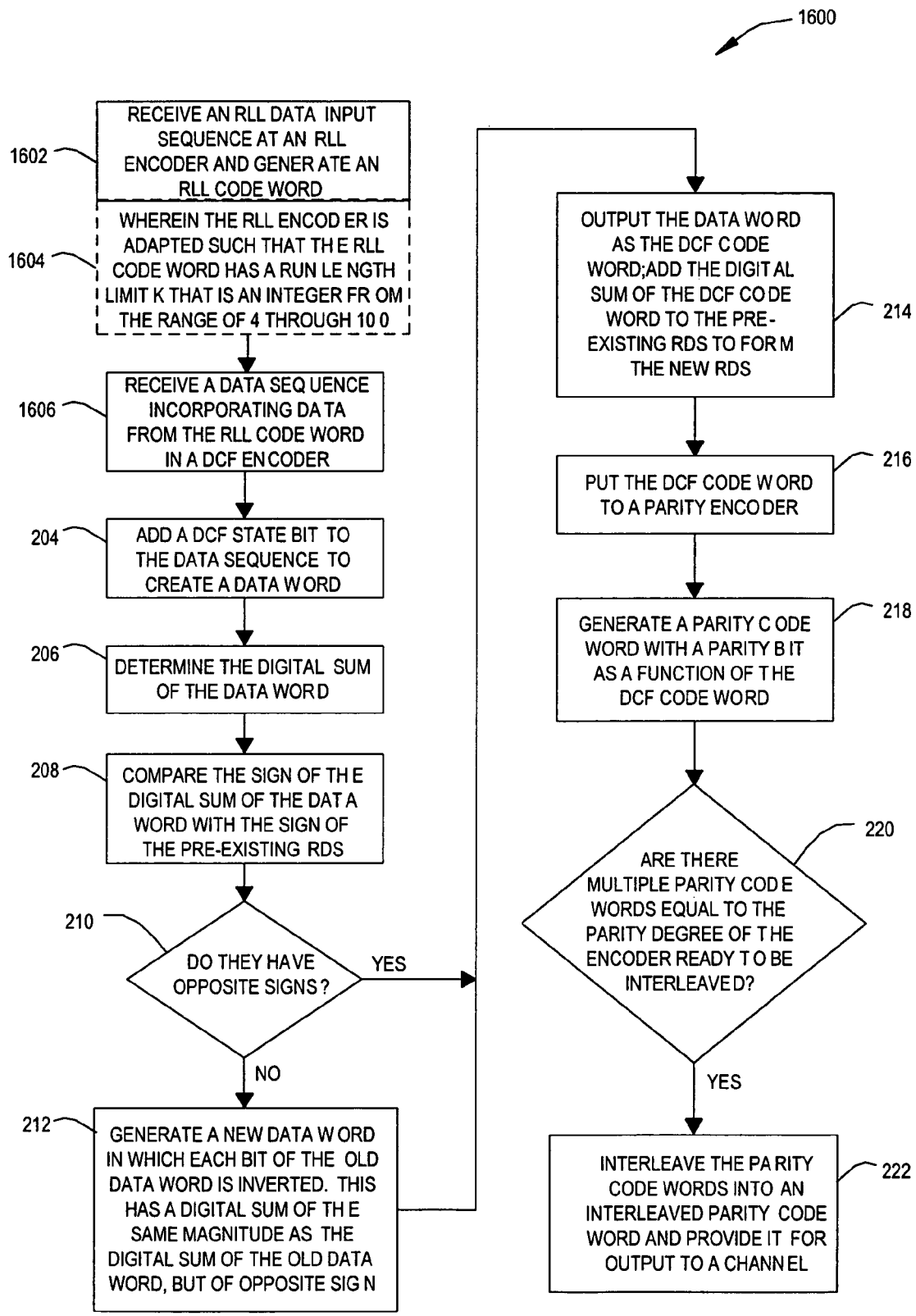
FIG. 16 is a flow chart depicting a system for encoding and transmitting data according to the present invention, according to another illustrative embodiment.

The RLL encoder 162 is adapted to receive the data to be encoded, in the form of data sequences, and to generate an RLL code word of r bits as output corresponding to an input data sequence. The RLL encoder 162 adds at least one bit to an input data sequence to generate a corresponding RLL code word having a run length limit k, where the run length limit is the maximum number of zeroes in a row contained within the RLL code word. A typical value of k might be from 6 to 10, but could be consistent with providing a signal at any integer from 1 through 100, depending on the needs of the particular application in which the embodiment is used. For example, a value k=4 would provide for particularly high assurance of the reliable performance of a phase lock oscillator (PLO), while a value of k=100 would provide an extraordinarily advantageous code rate while still providing the advantage of an RLL condition, for applications without substantial PLO sensitivity. An illustrative example of this is depicted in FIG. 16, wherein method 1600 is an embodiment that includes step 1602, optional condition 1604, and step 1606, wherein optional condition 1604 includes wherein the RLL encoder is adapted such that the RLL code word has a run length limit k that is an integer from the range of 4 through 100. Method 1600 is otherwise similar to FIG. 5, described below. Other embodiments with values of k even lower than 4 and higher than 100 would be appropriate for other conditions.

Selecting the value of k involves a tradeoff between code rate and phase lock performance, which affects reliability of system performance. Phase lock refers to the timing clock driving the phase of a read/write, download/upload, receive/transmit signal through a certain device, such as heads 110. For example, the variation of rotational speed of the motor (not shown) that drives the magnetic media in a disc drive 100 results in non-uniform time intervals between read signal voltage pulses. Instead of using a timing clock based on an objective measure of time, the read signal itself is used to generate the timing signal. A PLO that locks the phase of the timing clock to the phase of the read pulse is used. A binary digit of "1" will correspond to a magnetic transition which will be read back as a pulse. To ensure the PLO is updated frequently, it is therefore desirable to ensure that a "1" will appear with some regularity.

An RLL encoding provides that assurance, by limiting the number of bits of "0" to a maximum number k to ensure that no more than k zeroes are read before a "1" appears to be read back as a pulse. The smaller the value of k; the more frequently the timing is updated, and the more reliably the PLO performs.

The RLL code word output from the RLL encoder 162 is then input to the transition precoder 164 in this embodiment. The transition precoder 164 is adapted to receive data, comprising data words, and to precode an input code word into a transition precoded code word.

In this transition preceding, each code word input to the transition precoder 164 is read such that each input bit is compared with a prior state bit which depends on the prior input bit. If the input bit is a 0, then an output bit is generated equal to the prior state bit. If the input bit is instead a 1, then an output bit is generated inverted to the prior state bit, such that 0 and 1 are inverted to each other in a binary code. The prior state bit is then replaced with a new prior state bit equal to the most recent output bit.

Before any of the desired input data is received by the transition precoder, the prior state bit may be in an arbitrary state. In this embodiment, it is preferred to eliminate that potential problem by initializing the prior state bit to 0. Other solutions may be applied in other embodiments.

Figure 4:
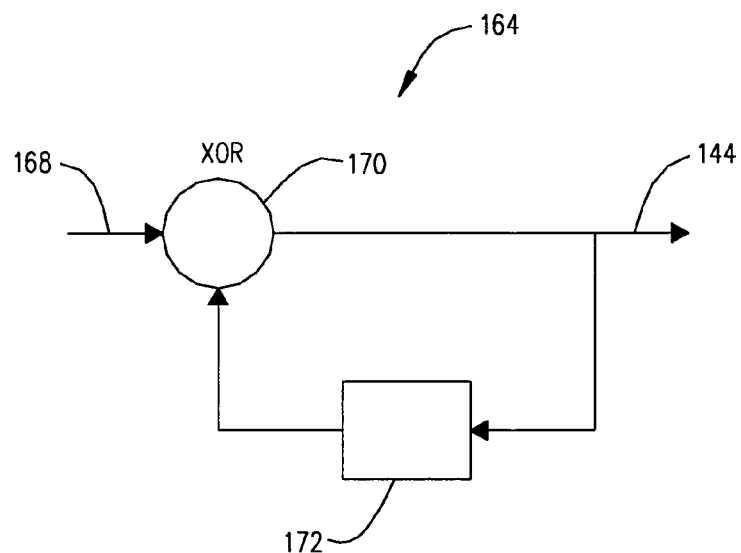
FIG. 4 is a block diagram of an embodiment of a precoder as a component of an embodiment of a system for encoding and transmitting data according to the present invention.

FIG. 4 depicts an embodiment of the transition precoder 164 by itself. In one embodiment, the register 172 is initialized to a 0 state before a data word is received. XOR gate 170 receives inputs from the register 172 and the transition precoder input line 168, and generates an XOR output to both the register 172 and the transition precoder output line 144.

The transition precoder 164 is not itself an encoder, and does not further encode data, nor influence data rate. Rather, it precodes the data, or prepares it into an optimized form for further encoding by the DCF encoder 142 and the interleaved parity encoder 148.

For example, the following Table 1 illustrates a hypothetical input data word and output transition precoded data word corresponding to the function of the transition precoder 164 in this embodiment. Also represented are bipolar symbols (BPS) of "+" and "−" corresponding to the output data word.

property is preserved or only slightly altered by any subsequent encoder comprised within the system.

Figure 6:
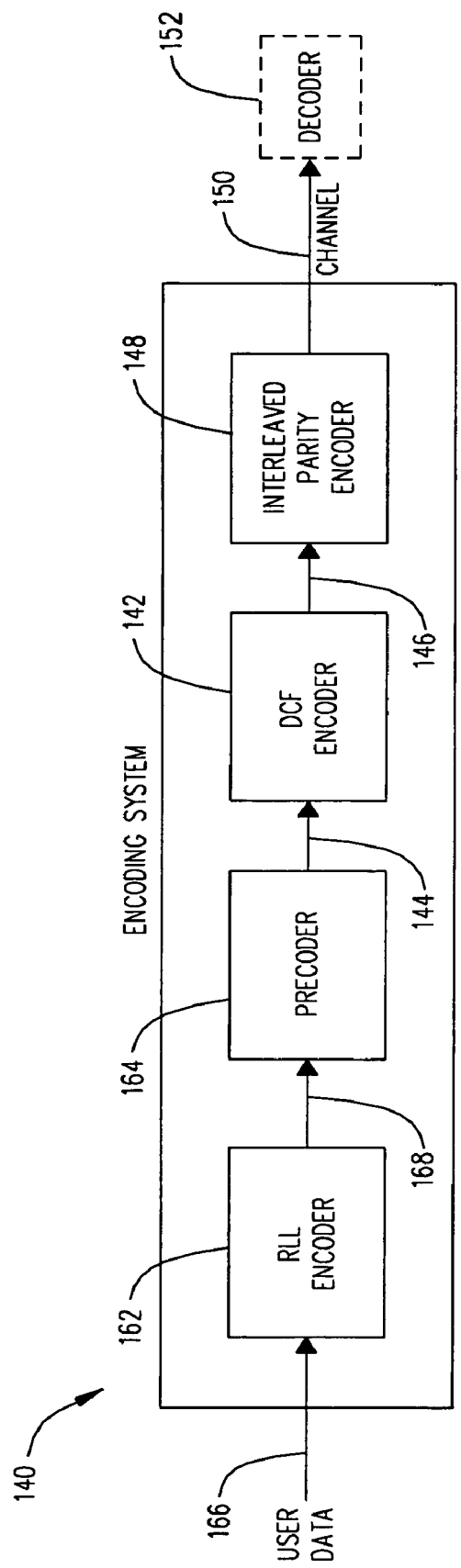
FIG. 6 is a block diagram of another embodiment of a system for encoding and transmitting data according to the present invention.

The result of the concatenated encoding is to provide an overall write code word, as an interleaved parity code word in this embodiment, to the channel. The system may also comprise a decoder 152 adapted to receive the write code word, in particular the interleaved parity code word, from the channel 150, as depicted for example in FIG. 6. The decoder is adapted to decode the code word in light of the encoding used by the particular embodiment, and generate therefrom a read signal. The read signal will consist of the same or a substantially similar sequence of bits as the original input data sequence, particularly as ensured by the various error correction methods apparent in the encoding as discussed above.

As an example of this concatenated encoding system, an embodiment may have an RLL code with r=100 and k=8, such that the RLL encoder 162 receives data in input data words of 99 bits each and generates RLL code words of 100 bits each. Each RLL code word is processed by the transition precoder 164, then fed to a DCF encoder that adds a single DCF state bit to the code word and generates a DCF code word with 101 bits that conforms to the DC free condition. The DCF code words are then put to the interleaved parity encoder 148. The interleaved parity encoder 148, in turn, receives and re-orders a sequence of DCF code words into reordered intermediate code words of 60 bits each. The interleaved parity encoder 148 then interleaves these code words to degree four, and adds four parity bits of modulus 2, one for each 60-bit data word, generating thereby a single 244-bit interleaved parity code word.

The bits are only re-ordered and interleaved with each other and with new parity bits, but are not changed, in the encoding from DCF code words to interleaved parity code words, in this embodiment. The DC free property will be only minimally altered by the generation of the interleaved parity code words, with at most an addition of 4 to the digital sum of the 244-bit interleaved parity code word. The RLL condition is also only minimally altered.

Figure 12:
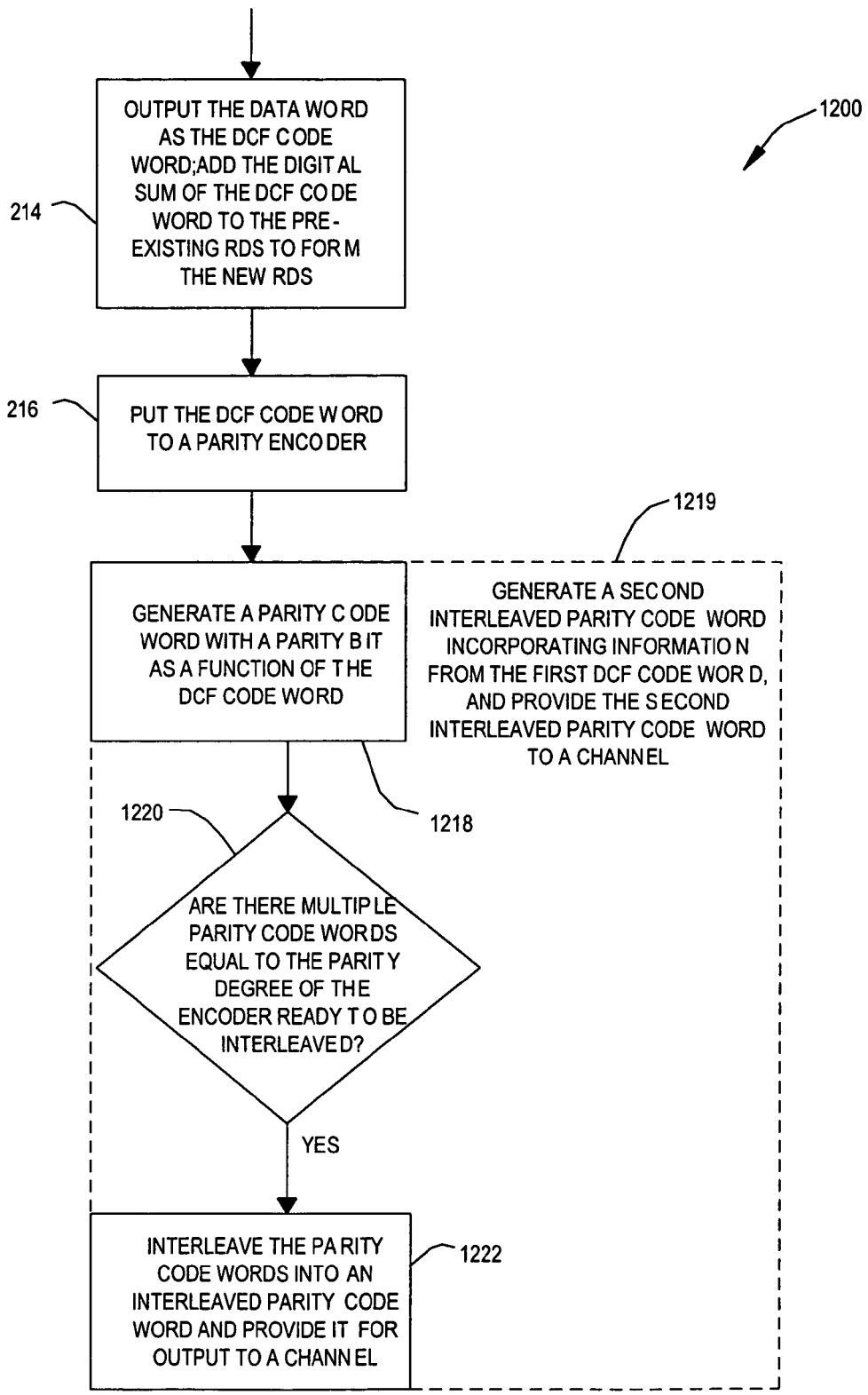
FIG. 12 is a flow chart depicting a system for encoding and transmitting data according to the present invention, according to another illustrative embodiment.

FIG. 12 depicts illustrative method 1200, according to an illustrative embodiment analogous in many steps to FIG. 5. Method 1200 includes illustrative optional condition 1219, associated generally with steps 1218, 1220, and 1222, to generate a second interleaved parity code word incorporating information from the first DCF code word, and provide the second interleaved parity code word to a channel.

In a preferred embodiment such as this one, the parity bits are distributed in the interleaved parity code word with greater than k spacing from each other, so at most one parity bit will be included in a single run of zeroes, and the run

TABLE 1

| Input bits |   | 1 | 0 | 0 | 1 | 1 | 1 | 0 | 0 | 0 | 0 | 1 | 0 | 1 | 1 | 0 | 0 | 0 | 1 | 0 | 1 |
|---|---|---|---|---|---|---|---|---|---|---|---|---|---|---|---|---|---|---|---|---|---|
| Output bits | 0 | 1 | 1 | 1 | 0 | 1 | 0 | 0 | 0 | 0 | 0 | 1 | 1 | 0 | 1 | 1 | 1 | 1 | 0 | 0 | 1 |
| Output (BPS) |   | + | + | + | − | + | − | − | − | − | − | + | + | − | + | + | + | + | − | − | + |

The output of the transition precoder 164, thus RLL encoded and transition precoded, is then input into the DCF encoder 142, in this embodiment. This particular combination of encoding sub-systems provides unique and unexpected advantages. A sequence of data encoded by this entire sequential embodiment of a system of encoding and transmitting data has the benefit of RLL encoding, transition precoding, DCF encoding, and interleaved parity coding, in an ingeniously concatenated format, such that each encoding length limit within the parity interleaved code word is extended by 1 at most. All this is achieved with a high-performance overall system code rate of approximately 0.964, or precisely, (99*100*60)/(100*101*61)=5,940/6, 161. A system code rate is found simply by multiplying the individual code rates of the encoders comprised in the system 140.

On the other hand, strong DC free conditions are particularly advantageous in some applications. In such a case, it will be desirable to use an embodiment in which the code rate on the DCF encoder 142 is relatively low. In that case, it may also be desirable to raise the code rate, and thereby lower the effectiveness, of at least one of the other influences on the system code rate, namely the RLL encoder 162 and the interleaved parity encoder 148.

For example, in an embodiment conforming again to FIG. 2, the RLL code rate has been raised all the way to 1 by doing away with the RLL encoder 162 in this particular embodiment. On the other hand, this DCF encoder 142 provides a relatively strong DCF condition by using an n value of 20. Accordingly, this DCF encoder 142 inputs data words of 19 bits and adds one DCF state bit thereto, outputting DCF code words of 20 bits each and enforcing a maximum absolute value of digital sum after each code word output of 20. The code rate of the DCF encoder was correspondingly lowered to 0.95, which is 19/20.

Figure 7:
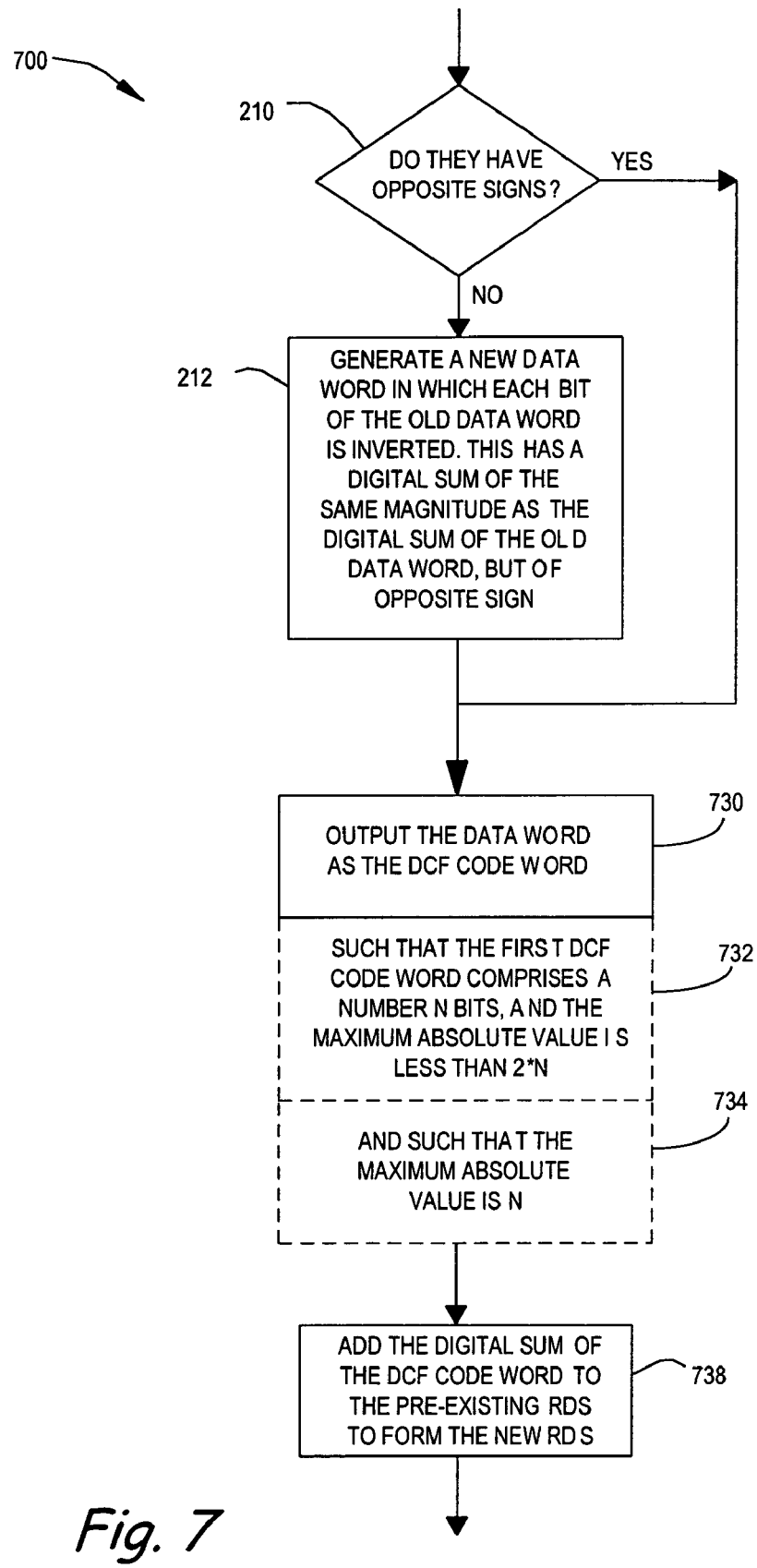
FIG. 7 is a flow chart depicting a system for encoding and transmitting data according to the present invention, according to an illustrative embodiment.
Figure 8:
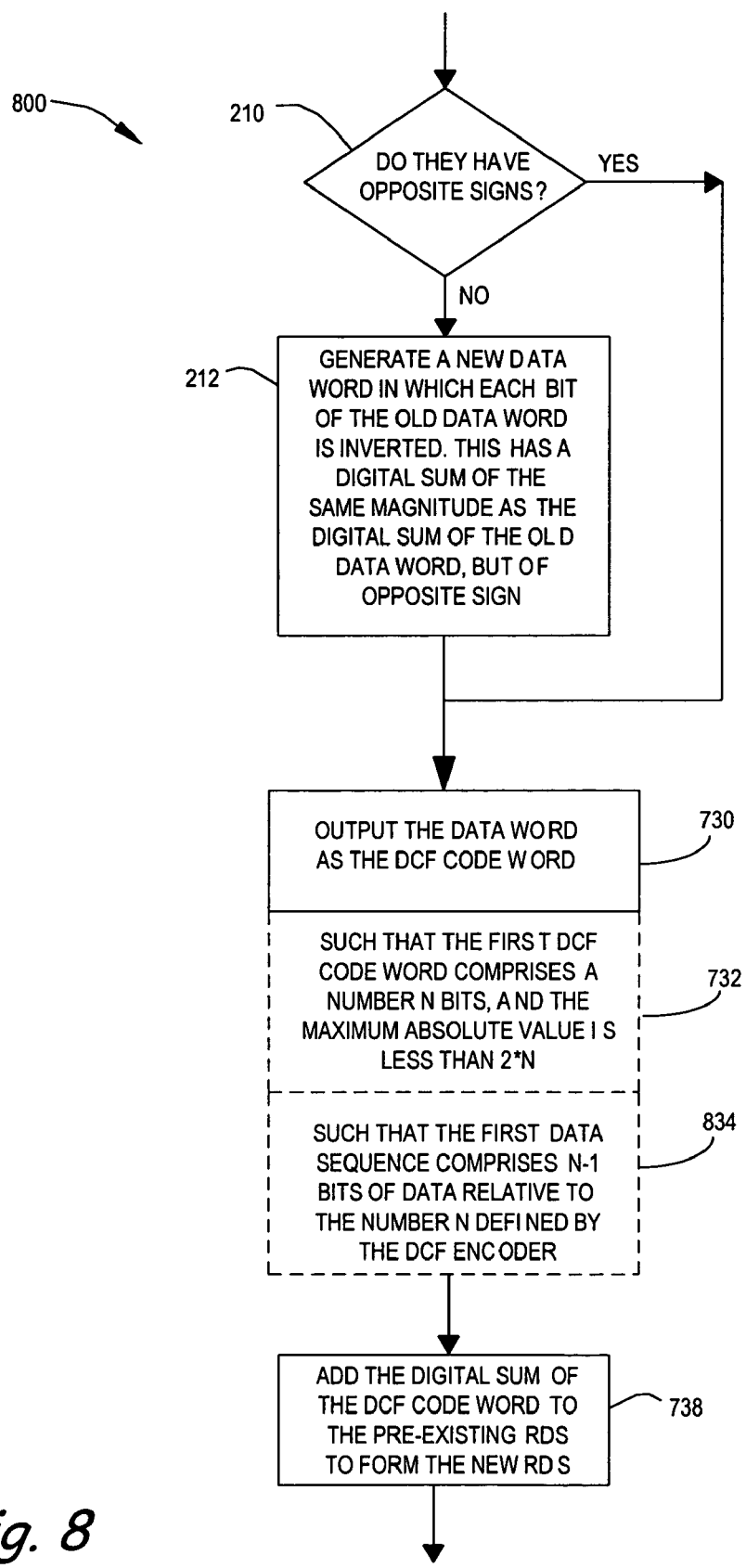
FIG. 8 is a flow chart depicting a system for encoding and transmitting data according to the present invention, according to another illustrative embodiment.
Figure 9:
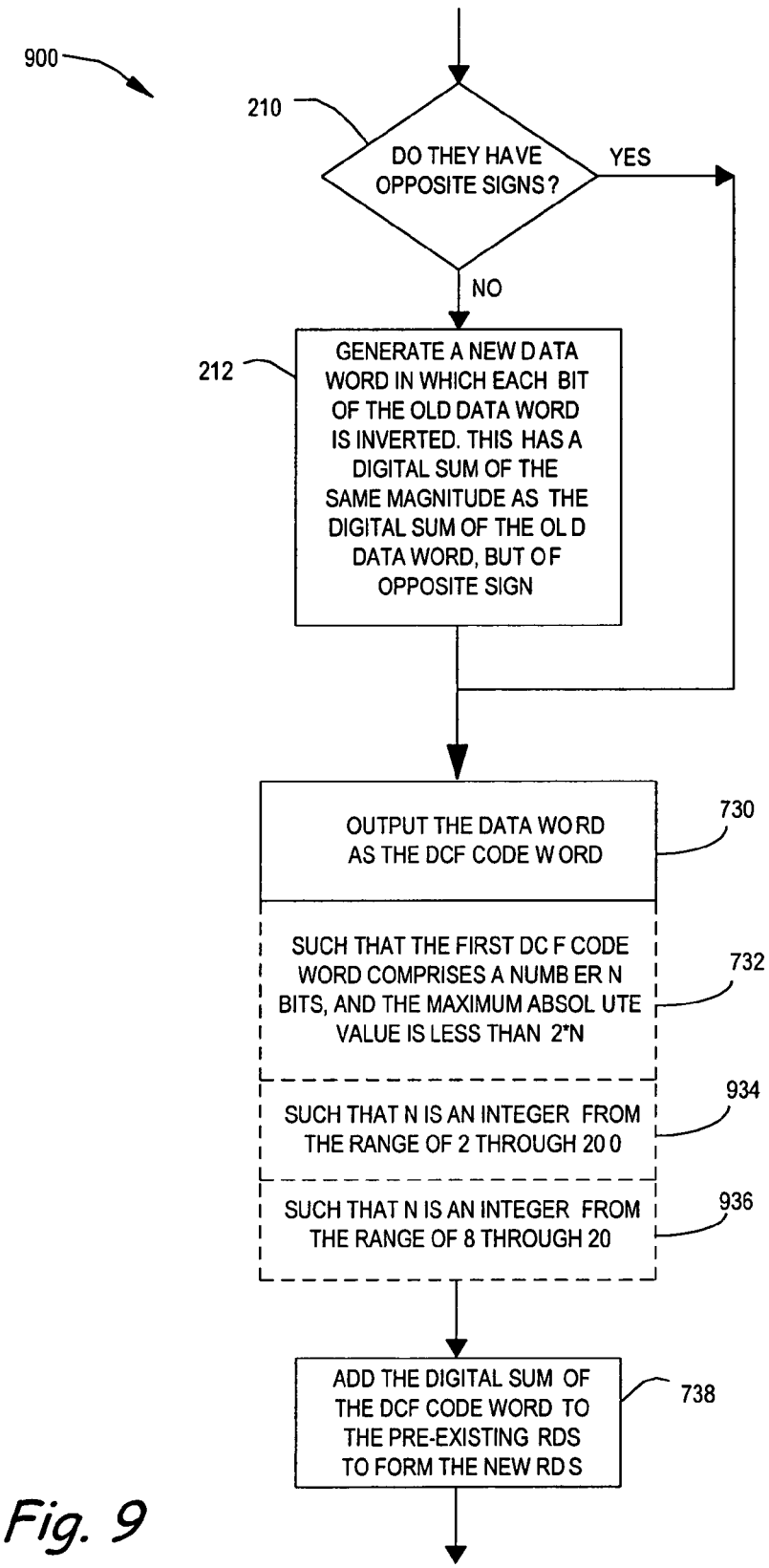
FIG. 9 is a flow chart depicting a system for encoding and transmitting data according to the present invention, according to another illustrative embodiment.
Figure 10:
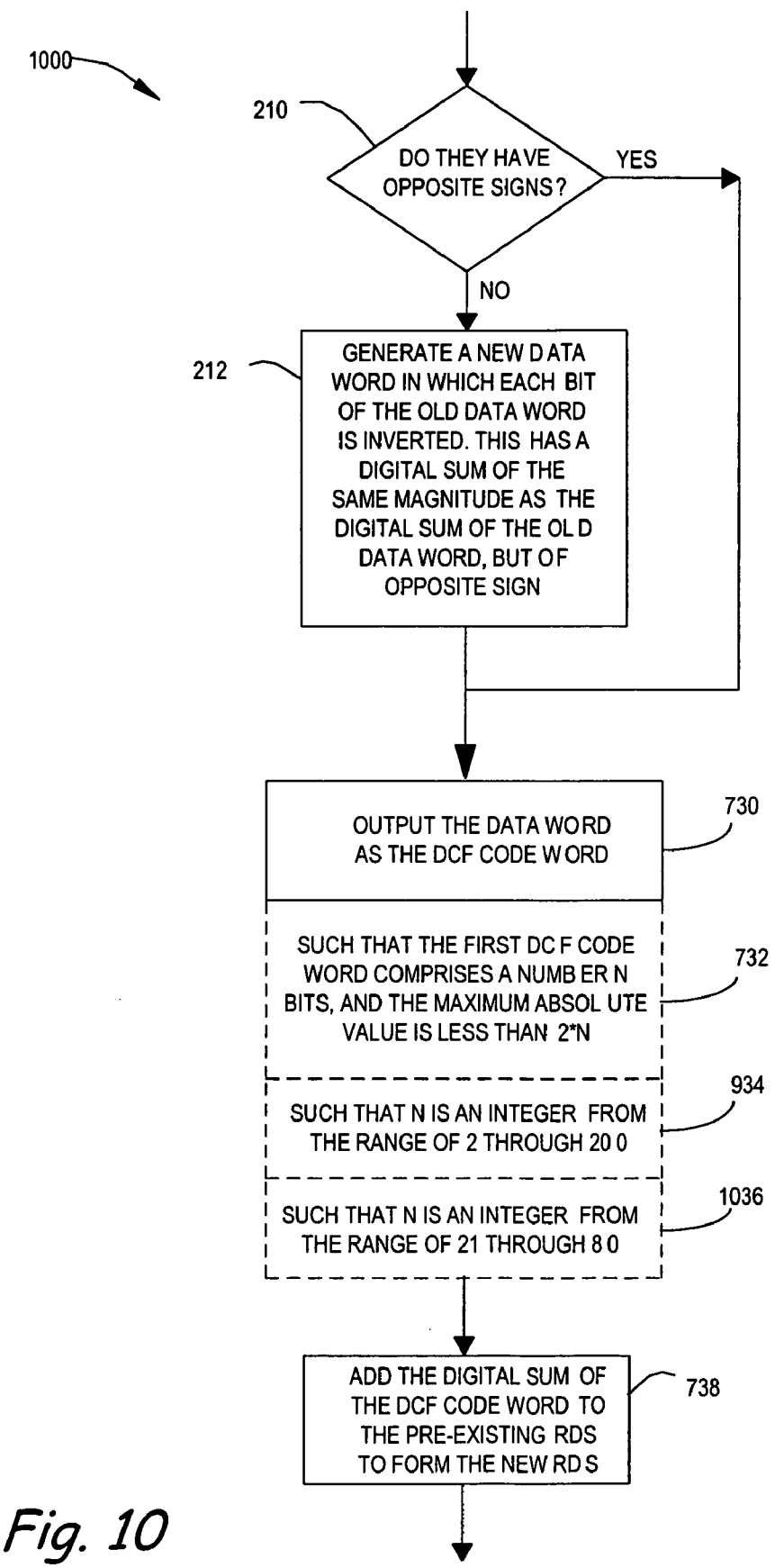
FIG. 10 is a flow chart depicting a system for encoding and transmitting data according to the present invention, according to another illustrative embodiment.

Other illustrative options for the values of n and the maximum absolute value of the DCF code words are depicted in FIGS. 7 through 10 as step 730, which includes different illustrative optional conditions in each of FIGS. 7 through 10. Step 730 follows steps 210 and 212 and is followed by step 738, in a method otherwise analogous to that of method 200 of FIG. 5, in each of FIGS. 7 through 10. In FIG. 7, step 730 of method 700 includes the illustrative optional conditions 732 and 734. In FIG. 8, step 730 of method 800 includes the illustrative optional conditions 732 and 834. In FIG. 9, step 730 of method 900 includes the illustrative optional conditions 732, 934 and 936. In FIG. 10, step 730 of method 1000 includes the illustrative optional conditions 732, 934 and 1036.

In this embodiment, the operation of the interleaved parity encoder is the same as in the one immediately above, with input code words of 60 bits each and a code rate of 60/61. The overall system code rate is then approximately 0.934, or (19*60)/(20*61). This is significantly lower than before, but nevertheless represents an optimized tradeoff of relative performance among different properties, including RLL condition, DCF condition, interleaved parity condition, system code rate, and other possible factors, which are optimized for a particular application. The present invention encompasses a broad variety of other possible iterations by which the present system for encoding and transmitting data may be optimized for a particular application.

FIG. 5 depicts an embodiment of a method 200 comprised within the system for encoding and transmitting data of the present invention. At step 202, a first data sequence is received by a DCF encoder. At step 204, a DCF state bit is added to the first data sequence by the DCF encoder to create an intermediate data word. At step 206, the digital sum of the data word is determined. At step 208, the sign of the digital sum of the data word is compared with the sign of the pre-existing RDS.

At decisional step 210, if the digital sum and the pre-existing RDS do not have opposite signs, then the next step is step 212, while if the digital sum and the RDS do have opposite signs, then the next step is step 214. At step 212, a new data word is generated in which each bit of the old data word is inverted, rendering a digital sum of the same magnitude as the digital sum of the old data word, but of the opposite sign.

At step 214, the data word is output as the DCF code word, and the digital sum of the DCF code word is added to the pre-existing RDS to generate a new RDS. At step 216, the DCF encoded data word is put to a parity encoder. At step 218, a parity code word is generated with a parity bit as a function of the DCF code word. At decisional step 220, if there are multiple parity code words of the parity degree of the parity encoder ready to be interleaved, then the parity code words of the parity degree are interleaved into an interleaved parity code word, and provided for output to a channel.

Figure 13:
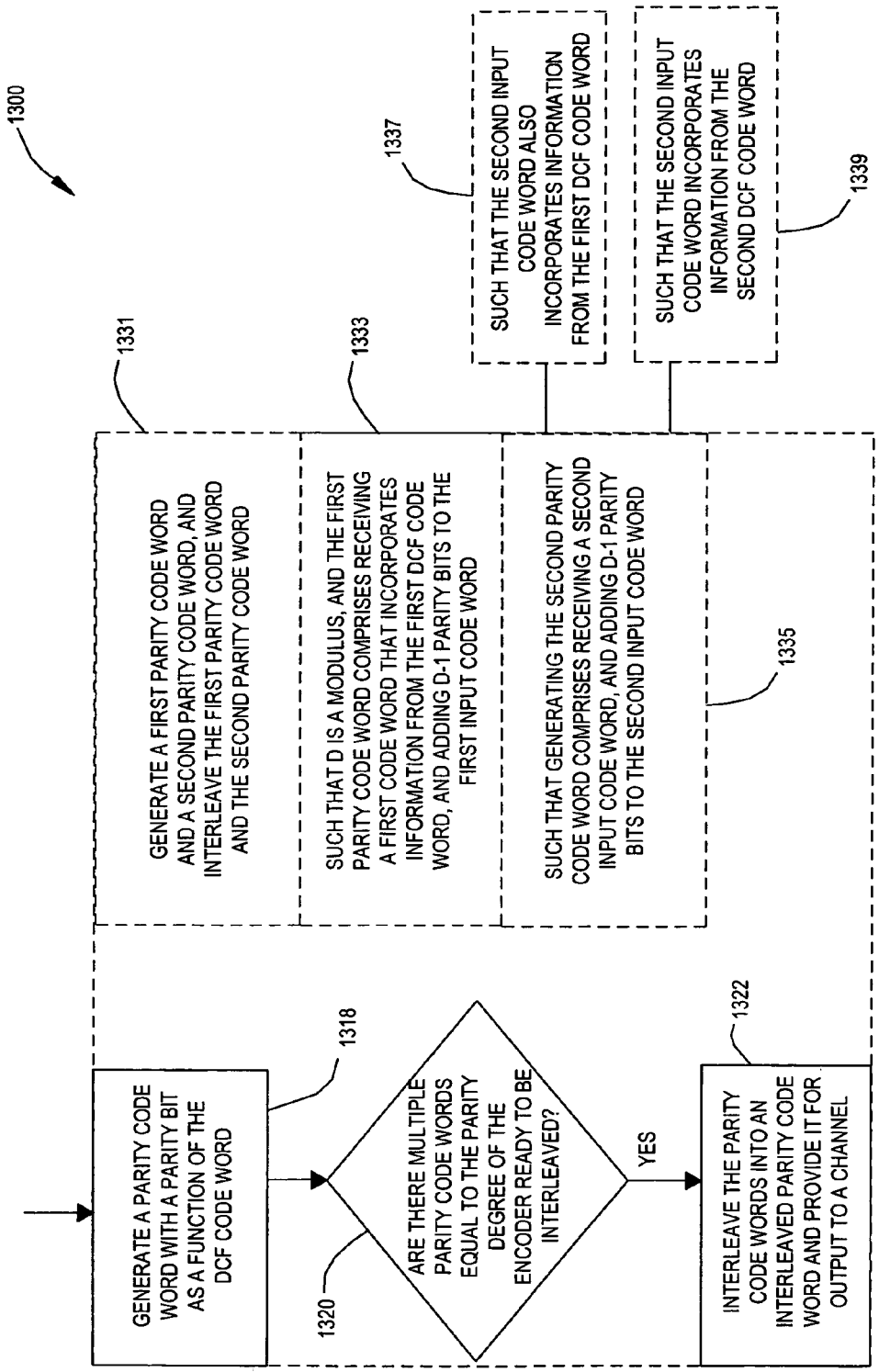
FIG. 13 is a flow chart depicting a system for encoding and transmitting data according to the present invention, according to another illustrative embodiment.
Figure 14:
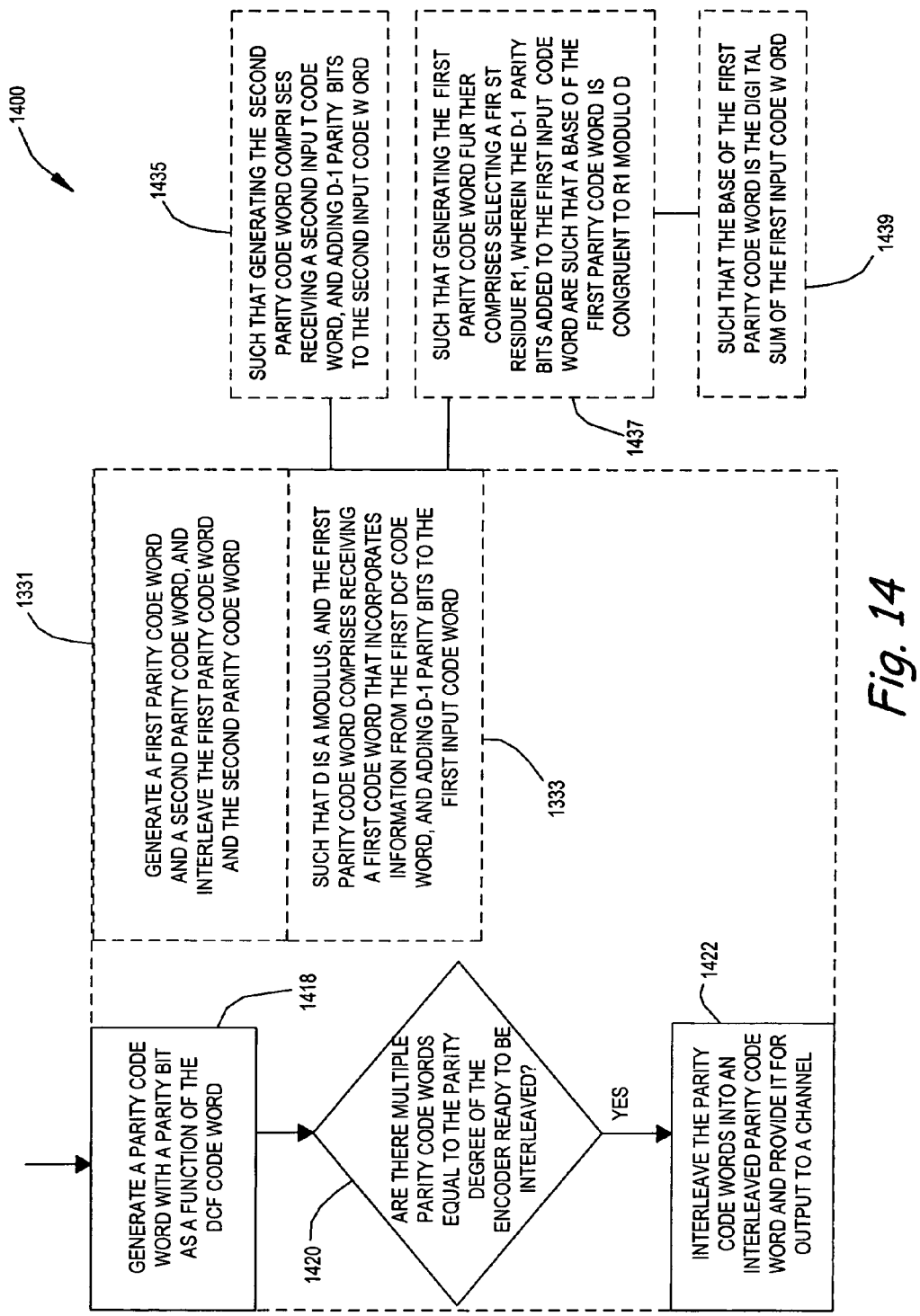
FIG. 14 is a flow chart depicting a system for encoding and transmitting data according to the present invention, according to another illustrative embodiment.
Figure 15:
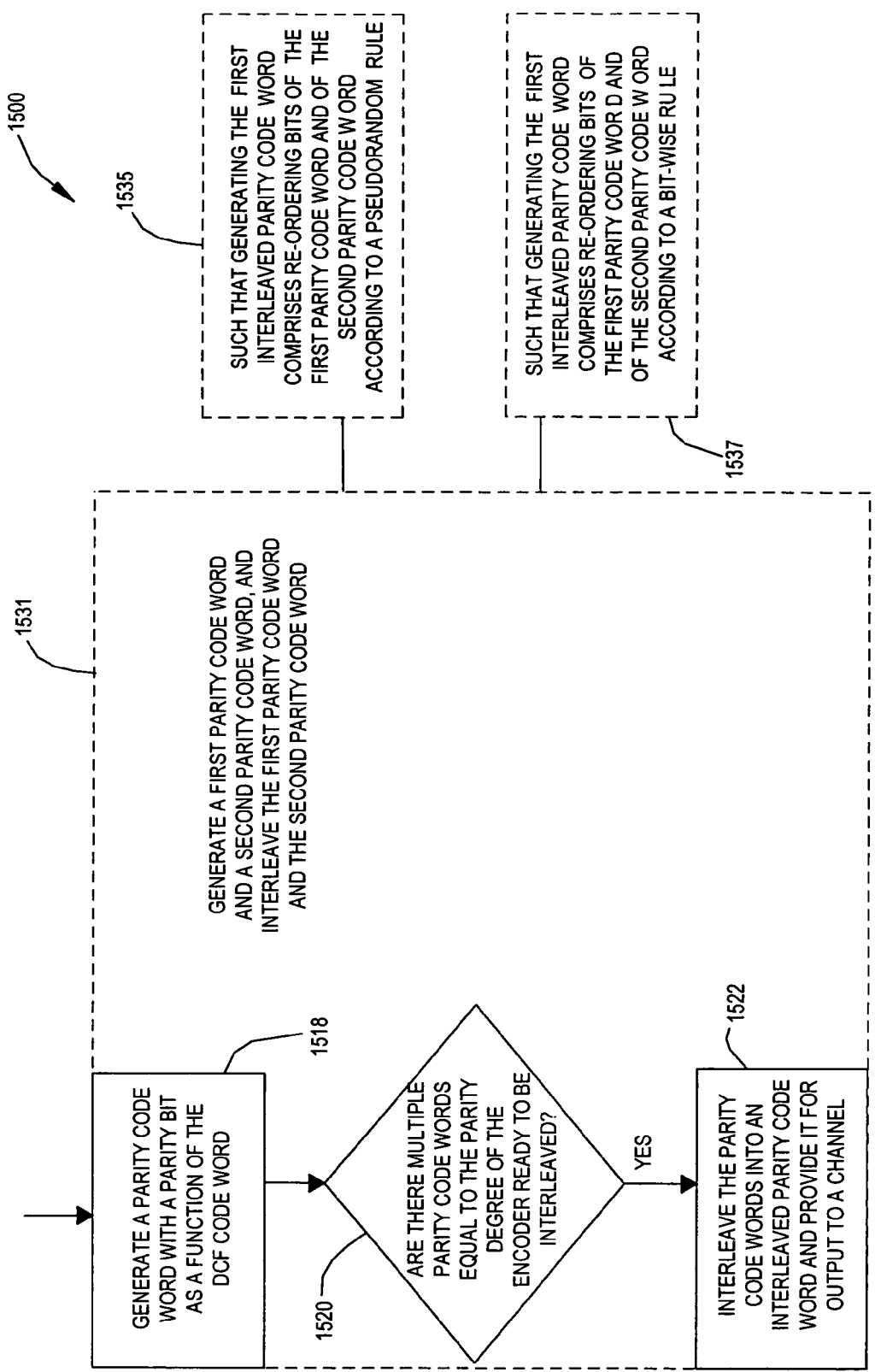
FIG. 15 is a flow chart depicting a system for encoding and transmitting data according to the present invention, according to another illustrative embodiment.

FIGS. 13 through 15 depict additional illustrative embodiments of encoding system methods. FIG. 13 depicts method 1300 according to an illustrative embodiment, which is analogous to method 200 except as depicted otherwise. Method 1300 includes additional step 1331, and optional conditions 1333 and 1335, associated with steps 1318, 1320 and 1322. Step 1331 includes to generate a first parity code word and a second parity code word, and interleave the first parity code word and the second parity code word. Condition 1333 includes that d is a modulus, and the first parity code word comprises receiving a first code word that incorporates information from the first DCF code word, and adding d-1 parity bits to the first input code word. Condition 1335 includes that generating the second parity code word comprises receiving a second input code word, and adding d-1 parity bits to the second input code word. Condition 1335 may have one of two further conditions, 1337 and 1339, associated with it. Condition 1337 includes that the second input code word also incorporates information from the first DCF code word. Condition 1339 includes that the second input code word incorporates information from the second DCF code word.

FIG. 14 depicts method 1400, according to an illustrative embodiment which is analogous to method 1300 except as depicted otherwise. Method 1400 includes additional step 1331 and optional condition 1333, and associated with steps 1418, 1420 and 1422. Optional condition 1333 may have either of additional optional conditions 1435 and 1437 associated with it, and condition 1437 may further have optional condition 1439 associated with it. Optional condition 1435 includes that generating the second parity code word comprises receiving a second input code word, and adding d-1 parity bits to the second input code word. Optional condition 1437 includes that generating the first parity code word further comprises selected a first residue r1, wherein the d-1 parity bits added to the first input code word are such that a base of the first parity code word is congruent to r1 modulo d. Optional condition 1439 includes that the base of the first parity code word is the digital sum of the first input code word.

FIG. 15 depicts method 1500, according to an illustrative embodiment which is analogous to method 1300 except as depicted otherwise. Method 1500 includes additional step 1531, associated with steps 1518, 1520 and 1522, step 1531 including to generate a first parity code word and a second parity code word, and interleave the first parity code word and the second parity code word. Step 1531 may also include either of optional conditions 1535 or 1537, in different embodiments. Condition 1535 includes such that generating the first interleaved parity code word comprises re-ordering bits of the first parity code word and of the second parity code word according to a pseudorandom rule. Condition 1537 includes such that generating the first interleaved parity code word comprises re-ordering bits of the first parity code word and of the second parity code word according to a bit-wise rule.

Although the present invention has been described with reference to certain representative embodiments, workers skilled in the art will recognize that these embodiments are illustrative of just a few examples contained within the metes and bounds of the invention, and that changes may be made in form and detail without departing from the spirit and scope of the invention, particularly in matters of structure and arrangement of parts within the principles of the present invention, to the full extent indicated by the broad, general meaning in which the appended claims are expressed.

For example, the particular elements may vary depending on the particular application for the communication system while maintaining substantially the same functionality, without departing from the scope and spirit of the present invention. In addition, although the embodiments described herein are directed to the example of a system for encoding and transmitting data in a disc drive, it will be appreciated by those skilled in the art that the present invention also encompasses embodiments applicable, for example, in satellite communications, wireless and wired telephone systems, computer networks and the Internet, and any other system involving encoding and transmission of digital signals, without departing from the scope and spirit of the present invention.

What is claimed is:

1. An encoding system for encoding digital data for transmission through a communication channel, comprising:
    a DCF encoder, adapted to receive a first data sequence, and to generate a first DCF code word and a new running digital sum, both of which incorporate information from the first data sequence and a pre-existing running digital sum, wherein the new running digital sum is limited to a maximum absolute value; and
    a parity encoder operatively coupled to the DCF encoder, and adapted to receive the first DCF code word from the DCF encoder, and to generate a first interleaved parity code word incorporating information from the first DCF code word, and to provide the first interleaved parity code word to a channel.

2. The encoding system of claim 1, wherein the parity encoder is further adapted such that generating the first interleaved parity code word comprises generating a first parity code word and a second parity code word, and interleaving the first parity code word and the second parity code word.

3. The encoding system of claim 2, wherein the parity encoder is further adapted such that d is a modulus, and such that generating the first parity code word comprises receiving a first input code word that incorporates information from the first DCF code word, and adding d-1 parity bits to the first input code word.

4. The encoding system of claim 3, wherein the parity encoder is further adapted such that generating the second parity code word comprises receiving a second input code word, and adding d-1 parity bits to the second input code word.

5. The encoding system of claim 4, wherein the parity encoder is further adapted such that the second input code word also incorporates information from the first DCF code word.

6. The encoding system of claim 4, wherein the parity encoder is further adapted such that the second input code word incorporates information from the second DCF code word.

7. The encoding system of claim 3, wherein the parity encoder is further adapted such that generating the first parity code word further comprises selecting a first residue r1, wherein the d-1 parity bits added to the first input code word are such that a base of the first parity code word is congruent to r1 modulo d.

8. The encoding system of claim 7, wherein the parity encoder is further adapted such that the base of the first parity code word is the digital sum of the first input code word.

9. The encoding system of claim 3, wherein the parity encoder is further adapted such that generating the second parity code word comprises receiving a second input code, and adding d-1 parity bits to the second input code word.

10. The encoding system of claim 2, wherein the parity encoder is further adapted such that generating the first interleaved parity code word comprises re-ordering bits of the first parity code word and of the second parity code word according to a pseudorandom rule.

11. The encoding system of claim 2, wherein the parity encoder is further adapted such that generating the first interleaved parity code word comprises re-ordering bits of the first parity code word and of the second parity code word according to a bit-wise rule.

12. The encoding system of claim 1, wherein the DCF encoder is further adapted such that the first DCF code word comprises a number n bits, and the maximum absolute value is less than $2*n$.

13. The encoding system of claim 12, wherein the DCF encoder is further adapted such that n is an integer from the range of 2 through 200.

14. The encoding system of claim 13, wherein the DCF encoder is further adapted such that n is an integer from the range of 8 through 20.

15. The encoding system of claim 13, wherein the DCF encoder is further adapted such that n is an integer from the range of 21 through 80.

16. The encoding system of claim 12, wherein the DCF encoder is further adapted such that the maximum absolute value is n.

17. The encoding system of claim 12, wherein the DCF encoder is further adapted such that the first data sequence comprises n-1 bits of data relative to the number n defined by the DCF encoder.

18. The encoding system of claim 1, further comprising an RLL encoder operatively coupled to the DCF encoder, wherein the RLL encoder is adapted to receive an RLL input data sequence, and to generate a first RLL code word, wherein the first data sequence, received by the DCF encoder, incorporates information from the first RLL code word.

19. The encoding system of claim 18, further comprising a transition precoder operatively coupled to the RLL encoder and to the DCF encoder, wherein the transition precoder is adapted to receive the first RLL code word, and to generate a transition precoded code word incorporating information from the first RLL code word, wherein the DCF encoder is further adapted such that the first data sequence, received by the DCF encoder, incorporates information from the first transition precoded code word.

20. The encoding system of claim 18, wherein the RLL encoder is further adapted such that a run length limit k of the first RLL code word is an integer from the range of 4 through 100.

21. The encoding system of claim 1, further comprising a decoder adapted to receive the interleaved parity code word from the channel, and to generate a read signal incorporating information from the interleaved parity code word.

22. The encoding system of claim 21, wherein the read signal is substantially similar to the first data sequence.

23. The encoding system of claim 1, wherein the parity encoder is further adapted to generate at least two parity bits as a function of the DCF code word, and to generate the first interleaved parity code word incorporating the parity bits therein.

24. The encoding system of claim 1, wherein the parity encoder is further adapted to generate a second interleaved parity code word incorporating information from the first DCF code word, and to provide the second interleaved parity code word to a channel.

25. The encoding system of claim 1, further comprising a transition precoder operatively coupled to the DCF encoder, wherein the transition precoder is adapted to receive a transition precoder input code word, and to generate a transition precoded data word, wherein the first data sequence, received by the DCF encoder, incorporates information from the first transition precoded data word.

26. A method for encoding a data sequence, comprising the steps of:
  receiving a first data sequence by a DCF encoder;
  generating a first DCF code word, incorporating information from the first data sequence and a pre-existing running digital sum, by the DCF encoder;
  generating a new running digital sum, incorporating information from the first data sequence and a pre-existing running digital sum, by the DCF encoder, wherein the new running digital sum is limited to a maximum absolute value;
  receiving the first DCF code word from the DCF encoder, by a parity encoder;
  generating a first interleaved parity code word, incorporating information from the first DCF code word, by the interleaved parity code word; and
  providing the first interleaved parity code word to a channel.

27. The method for encoding a data sequence of claim 26, further comprising the steps of:
  receiving a first input data sequence by an RLL encoder; and
  generating a first RLL code word by the RLL encoder, wherein the first data sequence, received by the DCF encoder, incorporates information from the first RLL code word.

28. The method for encoding a data sequence of claim 26, further comprising the steps of:
  receiving a first input data sequence by a transition precoder; and
  generating a first transition precoded data word, wherein the first data sequence, received by the DCF encoder, incorporates information from the first transition precoded data word.

* * * * *